(12) United States Patent
Lohia et al.

(10) Patent No.: US 11,770,900 B2
(45) Date of Patent: Sep. 26, 2023

(54) PRINTED CIRCUIT BOARD LAYOUT

(71) Applicant: ABB Schweiz AG, Baden (CH)

(72) Inventors: Alok K. Lohia, Dallas, TX (US); Arturo Silva, Allen, TX (US); Robert J. Catalano, Mesquite, TX (US); Robert J. Roessler, Wylie, TX (US)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 17/546,812

(22) Filed: Dec. 9, 2021

(65) Prior Publication Data

US 2023/0189443 A1    Jun. 15, 2023

(51) Int. Cl.
*H05K 1/18* (2006.01)
*H02M 3/00* (2006.01)
*H05K 1/11* (2006.01)
*H02M 7/00* (2006.01)

(52) U.S. Cl.
CPC .......... *H05K 1/184* (2013.01); *H02M 3/003* (2021.05); *H02M 7/003* (2013.01); *H05K 1/114* (2013.01); *H05K 2201/1003* (2013.01)

(58) Field of Classification Search
CPC ......... H05K 1/181; H05K 1/183; H05K 1/184
See application file for complete search history.

(56) References Cited

U.S. PATENT DOCUMENTS

| | | | |
|---|---|---|---|
| 2005/0189640 A1* | 9/2005 | Grundy | H05K 1/182 257/E25.023 |
| 2010/0163783 A1* | 7/2010 | Fung | C08G 59/304 252/73 |

OTHER PUBLICATIONS

Anonymous, "Advantages and Disadvantages of Halogen Free PCB Materials," AiPCBA, Blog post, 2 pp. (Jun. 30, 2020).
EPA, "Flame Retardants in Printed Circuit Boards: Chapter 2," Final Report, EPA Publication 744-R-15-001: 13 pp. (Aug. 2015).
International Electrotechnical Commission, "Materials for printed boards and other interconnecting structures—Part 2-21: Reinforced base materials, clad and unclad—Non-halogenated epoxide woven E-glass reinforced laminated sheets of defined flammability (vertical burning test), copper-clad," IEC 61249-2-21: 50 pp. (Nov. 1, 2003).
International Electrotechnical Commission, "Materials for printed boards and other interconnecting structures—Part 2-2: Reinforced base materials, clad and unclad—Phenolic cellulose paper reinforced laminated sheets, high electrical grade, copper-clad," IEC 61249-2-2: 34 pp. (Jan. 1, 2005).

* cited by examiner

*Primary Examiner* — Jeremy C Norris
(74) *Attorney, Agent, or Firm* — Leydig, Voit & Mayer, Ltd.

(57) ABSTRACT

A printed circuit board (PCB) assembly is provided. The PCB assembly comprises a printed wiring board (PWB) and one or more electrical components mounted thereon. The PWB comprises a plurality of layers including conductive layers and insulative layers, where one or more of the insulative layers is a prepreg layer that is halogen-free; one or more slotted portions on a surface of the PWB, which are indented into the PWB; and one or more pads disposed on the surface of the PWB, which are paired with the one or more slotted portions. Each of the one or more electrical components is mounted on the surface of the PWB through a pair of a slotted portion and a pad.

20 Claims, 5 Drawing Sheets

PRINTED CIRCUIT BOARD LAYOUT

TECHNICAL FIELD

This disclosure relates generally to electronic packaging technologies, and more specifically to layout design of a printed circuit board (PCB).

BACKGROUND

Point of load (POL) converters are used in managing power distribution across an integrated circuit (IC). POL converters are placed close to high performance loads in an IC to serve as individual regulators (e.g., voltage regulators) that provide for immediate power supplies to their point of use. POL converters are popular solutions to meet high peak current demands with low noise margins, thus suitable for powering high performance semiconductors such as microcontrollers, application specific integrated circuits (ASICs), or input and output (I/O).

There is a need to improve the design of POL converters to meet the increasing demand of integration without compromising the performance of these devices.

SUMMARY

In some instances, a printed circuit board (PCB) assembly is provided. The PCB assembly includes a printed wiring board (PWB) and one or more electrical components disposed on a surface of the PWB. The PWB includes a plurality of layers including conductive layers and insulative layers, and one or more of the insulative layers is a prepreg layer that is halogen-free. The PWB also includes one or more slotted portions and one or more pads disposed on the surface of the PWB. Each of the one or more slotted portions is indented into the PWB such that the slotted portion has fewer layers than the plurality of layers. The one or more pads is paired with a respective one slotted portion of the one or more slotted portions. Each of the one or more electrical components includes a first leg and a second leg. The first leg of each of the one or more electrical components is inserted into one slotted portion of the one or more slotted portions, and the second leg of the each of the one or more electrical components is mounted on one pad of the one or more pads that is paired with the one slotted portion.

In some examples, the one or more slotted portions is located adjacent a first edge of the PWB and offset therefrom by a first distance.

In some variations, the one or more pads is located adjacent a second edge of the PWB and offset therefrom by a second distance. The second distance is shorter than the first distance.

In some instances, at least one slotted portion extends through two or more electrically conductive layers of the plurality of layers, and wherein the at least one slotted portion is at least partially plated with copper that electrically interconnects the two or more electrically conductive layers that the at least one slotted portion extends through.

In some examples, the at least one slotted portion electrically connects at least two different conductive layers.

In some variations, a first slotted portion on the PWB is indented into the PWB with a first depth and a second slotted portion on the PWB is indented into the PWB with a second depth.

In some instances, the first depth of the first slotted portion extends through a first number of conductive layers in the PWB.

In some examples, the second depth of the second slotted portion extends through a second number of conductive layers in the PWB. The first number of conductive layers is different from the second number of conductive layers.

In some variations, the one or more electrical components are one or more inductors.

In some instances, the second legs of the one or more inductors are mounted on the one or more slotted portions that are electrically connected to an output node that is connected to a load. The load is circuitry integrated on a circuit board that the PCB assembly is mounted on.

In some examples, the first legs of the one or more inductors are mounted on the one or more pads that are electrically connected to at least one switching node. The at least one switching node is connected to one or more electrical components that are mounted on the surface of the PWB.

In some variations, a printed wiring board (PWB) is provided. The PWB includes a plurality of layers including conductive layers and insulative layers, and one or more of the insulative layers is a prepreg layer that is halogen-free. The PWB also includes one or more slotted portions and one or more pads disposed on the surface of the PWB. Each of the one or more slotted portions is indented into the PWB such that the slotted portion has fewer layers than the plurality of layers. The one or more pads is paired with a respective one slotted portion of the one or more slotted portions.

In some instances, the one or more slotted portions is located adjacent a first edge of the PWB and offset therefrom by a first distance.

In some examples, the one or more pads is located adjacent a second edge of the PWB and offset therefrom by a second distance, wherein the second distance is shorter than the first distance.

In some variations, at least one slotted portion extends through two or more electrically conductive layers of the plurality of layers. The at least one slotted portion is at least partially plated with copper that electrically interconnects the two or more electrically conductive layers that the at least one slotted portion extends through.

In some instances, the at least one slotted portion electrically connects at least two different conductive layers.

In some examples, a first slotted portion on the PWB is indented into the PWB with a first depth and a second slotted portion on the PWB is indented into the PWB with a second depth.

In some variations, the first depth of the first slotted portion extends through a first number of conductive layers in the PWB.

In some instances, the second depth of the second slotted portion extends through a second number of conductive layers in the PWB. The first number of conductive layers is different from the second number of conductive layers.

In some examples, the one or more slotted portions are electrically connected to an output node that is connected to a load. The load is a circuitry integrated on a circuit board that the PWB is mounted on. The one or more pads are electrically connected to at least one switching node. The at least one switching node is connected to one or more electrical components that are mounted on the surface of the PWB.

DETAILED DESCRIPTION

Figure 1:
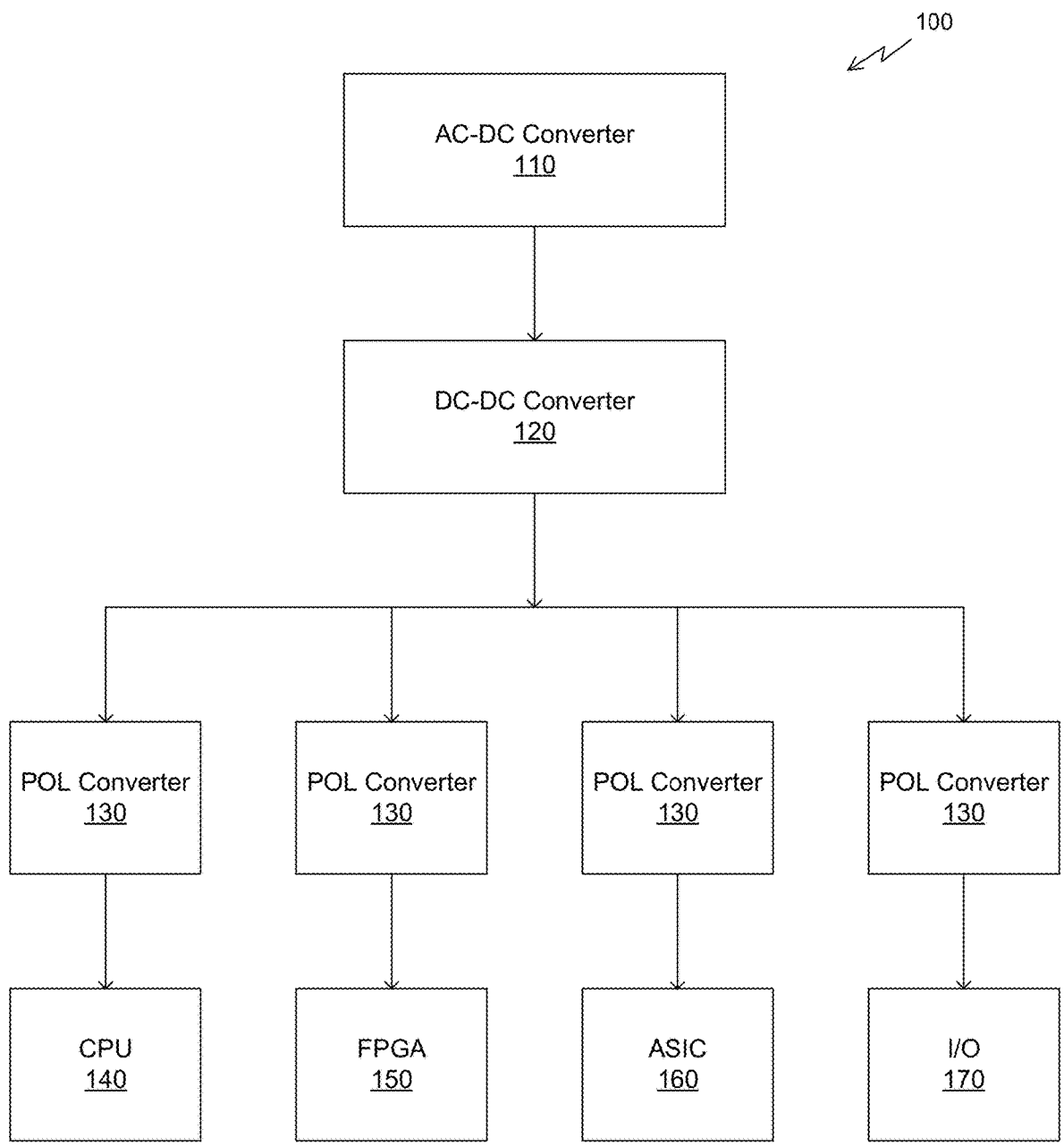
FIG. 1 is a block diagram depicting utilizing of POL converters in a power design scheme.

The following detailed description is exemplary in nature and is not intended to limit the disclosure or the application and uses of the disclosure. Furthermore, there is no intention to be bound by any expressed or implied theory presented in the preceding background, summary and brief description of the drawings, or the following detailed description.

In the following detailed description, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Next generation (NextGen) direct current (DC)-DC converters may include a POL converter designed to deliver a certain amperage (e.g., 160 Amps (A)) with an input voltage (Vin) range (e.g., from 7 Volts (V) to 14 V) with an output voltage. The current density or current per square unit of area may be a critical parameter.

One of the challenges of integrating POL converters into a highly integrated IC is to manage space on the IC to accommodate these POL converters. There is a need to reduce the footprint of the POL converters, thus allowing for more flexibilities to integrate POL converters into an IC layout. However, reducing the footprint of a POL also increases current density rating, which is a consideration for IC designers.

Another challenge of the POL converters is related to thermal performance. POL converters are power supplies that generate a large amount of heat, which poses challenges to thermal performance of the devices. With an increased power density, thermal issues could be worsened. Therefore, it is also needed to improve thermal performance of the POL converters while reducing footprint of these devices.

Traditionally, a solution of the POL converter is to provide slots on both sides of the PCB to provide mechanical stability to an inductor (e.g., an inductor coupled to the PCB) during vibration and movement during reflow process. These two slots may cause the PCB to be in increased size due to the minimum distance requirement from PCB edge to slot to avoid breaking the PCB during the manufacturing process.

As such, the present disclosure reduces the width of the PCB, thus reducing the footprint of the module by reducing the current density. In particular, due to the minimum gap between the slots and edges of the PCB because of PCB manufacturing rules, placing slots on both sides increases the width of the PCB, thereby increasing the footprint of the PCB and reducing the current density. The present disclosure allows for one slot on the PCB, which provides mechanical stability to the winding of the inductor on one side without increasing the PCB size. Additionally, the present disclosure uses a halogen-free material is used as prepreg, which improves the thermal and reliability behavior of the PCB.

Various examples of the present disclosure provide PCB assemblies that include halogen-free prepreg layers in PWBs of the PCB assemblies and layout designs that include slotted portions paired with pads on the PWBs for mounting electrical components, such that the PCB assemblies can have improved thermal rigidity and reduced overall footprint without compromising mechanical rigidities. In other words, the present disclosure provides a PCB layout where one side of the PCB has a slot to provide the mechanical stability to the winding and the other side has a pad for the inductor winding to land on the PCB. This may provide balancing of mechanical stability without increasing the footprint. The present disclosure uses halogen free prepreg that has higher thermal conductivity and lower coefficient thermal expansion (CTE) to improve the thermal performance and reliability performance.

By using a PCB with having slots and pads as well as using the halogen free prepreg, the present disclosure provides advantages including, but not limited to, reducing the footprint of the PCB, providing mechanical stability to one or more legs of the inductor winding, provides better thermal de-rating (e.g., the continuous maximum operation temperature (CMOT) of the PCB may be 150), and/or provides better thermal and reliability performance.

PWB is a printed wiring board, which is also known as a printed circuit board (PCB). A PCB assembly is a populated printed circuit board with all the components.

A slotted portion is an area on the PWB that is indented into the PWB such that the slotted portion has fewer layers than the PWB. In some examples, a slotted portion is through the PWB, which is also called a slot. In some instances, a slotted portion can be plated with metal (e.g., copper), such that the plated slotted portion provides electrical connections between different conductive layers of the PWB. In some examples, the sidewalls and/or the bottom of the slotted portions can be plated with metal, such as copper, to form electrical connections between different conductive layers and/or between electrical components that are mounted on the slotted portions and the conductive layers. A PWB may also include non-plated through-holes (NPTHs) and/or non-plated slotted portions that provides for thermal, mechanical, and/or isolation benefits to the PWB.

A PWB includes a number of conductive layers that provide for electrical connections among the components mounted on the PWB, and different conductive layers are electrically connected by plated through-holes (PTHs) and/or plated slotted portions. A PWB also includes a number of insulative/dielectric layers that separate different conductive layers. Some of the insulative layers are included in core layers. A core layer is made of a rigid base material (that is a dielectric/insulative layer) laminated with copper (that is a conductive layer) on one or both sides. Prepreg layers are also insulative layers. A prepreg layer is a layer made from a composite material, which may be fiberglass, and is pre-impregnated with a resin system. The resin system is typically an epoxy or a phenolic resin, and includes a curing agent. A multi-layer PWB is produced by laminating together alternating layers of prepreg and core and curing the prepreg layers.

In some examples, thermal performance of the PCB assemblies are improved by using halogen-free prepreg layers in PWBs that are included in the PCB assemblies. The halogen-free prepreg layers have a higher thermal conductivity that helps with heat dissipation and a lower coefficient of thermal expansion (CTE) that causes an improved rating of continuous maximum operation temperature (CMOT) of the device.

As an example, a halogen-free material, EM-370(Z), is compared with halogenated materials EM-825 and EM-827 in terms of thermal and mechanical properties. The EM-370 (Z) material has a higher thermal conductivity than the EM-825 and EM-827 materials. For instance, when tested using ASTM D5470 standard, thermal conductivity of the EM-370(Z) is tested to be 0.58, whereas thermal conductivities for the EM-825 and EM-827 are 0.46 and 0.44, respectively. The EM-370(Z) material also shows better mechanical properties as a prepreg layer comparing to the EM-825 and EM-827 materials due to lower CTEs along Z and X/Y directions and a lower Z-axis expansion from the test results. Additionally, CMOT rating for the EM-370(Z) board material is 150° C., whereas CMOT rating for the EM-827 board material is 130° C. In conclusion, the halogen-free material EM-370(Z) has better reliability, stability and thermal conductivity compared to the halogenated materials EM-825 and EM-827 when used as prepreg layers in PWBs. Other halogen-free materials may have similar or even better thermal and mechanical properties so as to be suitable for making prepreg layers in PWBs.

Footprint of a PCB assembly can be reduced by replacing one or more slotted portions that are indented into a PWB to one or more pads, such that the one or more pads are not restricted by a minimum distance requirement like the slotted portions when placed close to an edge of the PWB. Meanwhile, one leg of the electrical component remains mounted on a slotted portion on the PWB, thus ensuring mechanical rigidity of the electrical component on the PWB. In this way, the overall area of the PWB can be reduced without compromising mechanical rigidity of the mounted components, thus allowing for reducing footprint of the PCB assembly.

The disclosure hereinafter takes POL converters as an example to demonstrate the aforementioned techniques of reducing footprint of a PCB assembly without compromising thermal and mechanical rigidities. It will be appreciated that the disclosed techniques will not be limited to solely the applications of POL converters but rather are applied to all types of semiconductor devices that are applicable.

FIG. 1 is a block diagram 100 depicting one exemplary embodiment of a power design scheme utilizing POL converters 130 according to the present disclosure. The block diagram 100 includes different stages of power conversions that may or may not be part of a single IC board.

At the first stage, an AC-DC converter 110 converts an input AC voltage (e.g., at 230 VAC/110 VAC) to an isolated DC voltage. At the second stage, a DC-DC converter 120 steps down the DC voltage that is output from the first stage to a number of bus voltages and distributes power at the converted bus voltages across the IC board. For instance, the bus voltages may be 48 V, 24 V, or 12 V. In some instances, the first and the second stages can be combined to directly convert an input AC voltage to a number of DC bus voltages that are distributed across the IC board. In some variations, at least one of the first and second stages of power conversions is performed outside the IC board, therefore, the output power serves as an external power source to the IC board. Additional buck and/or boost converters may be integrated in the IC to further convert the bus voltages to different voltage values, for instance, in a range of 7-14 V. At the third stage, POL converters 130 that are placed close to loads on a circuit board further step down the bus voltages to required voltages (e.g., 0.4-2V) to power individual loads. The loads may be complex circuitry, such as a central processing unit (CPU) 140, a field programmable gate array (FPGA) 150, an ASIC 160, I/O 170 or other circuitries. The complex circuitries integrated on the IC board are often powered at different voltages. For instance, POL converters 130 may be utilized to power a PFGA 150 at 1.0 V and/or 1.2 V. For another instance, POL converters 130 may be utilized to power an ASIC 160 at 1.8 V and/or 1.5 V.

The power design scheme illustrated in FIG. 1 provides several benefits to the IC design. First, a bus voltage designed at a relatively higher voltage value allows for distributing the power across the IC board at a relatively lower current, such that thinner lines can be used for designing bus traces on the IC board. Second, placing the POL converters 130 near the loads (e.g., 140-170 as shown in FIG. 1) avoids a long wiring distance between a primary converter (e.g., the DC-DC converter 120) and complex circuitry (e.g., the CPU 140). Moreover, the POL converters 130 that are placed close to the loads provide for precise voltage supplies to their point of use, which meet low-voltage/high-current and low noise margin needs.

A wide variety of POL converter products are available for IC designers to select according to their needs. One of the factors that affects selection of a POL converter product is the footprint. A POL converter with a smaller footprint is more flexible to be integrated into an IC that is packed with electrical components and functional circuitries.

The present disclosure describes herein a layout design strategy that allows for a footprint reduction for a PWB. For example, some of the slots that are designed to mount one or more inductors in a POL converter device can be replaced by pads. The one or more inductors in the POL converter device are used for limiting power loss to heat and minimizing current ripple, which often have a significantly larger shape than the rest of the electrical components in a PCB assembly that is packaged in the POL converter device. Conventionally, the one or more inductors are mounted to a PWB by inserting both legs (or windings) into slots on the PWB that is included in the PCB assembly. However, when a slot is positioned close to an edge of the PWB, the position of the slot is restricted by a minimum distance requirement according to the PCB design guideline. By replacing a slot to a pad, the minimum distance requirement is no longer applied while positioning the pad close to an edge of the PWB, thus allowing for a reduction of the area of the PWB.

Figure 2A:
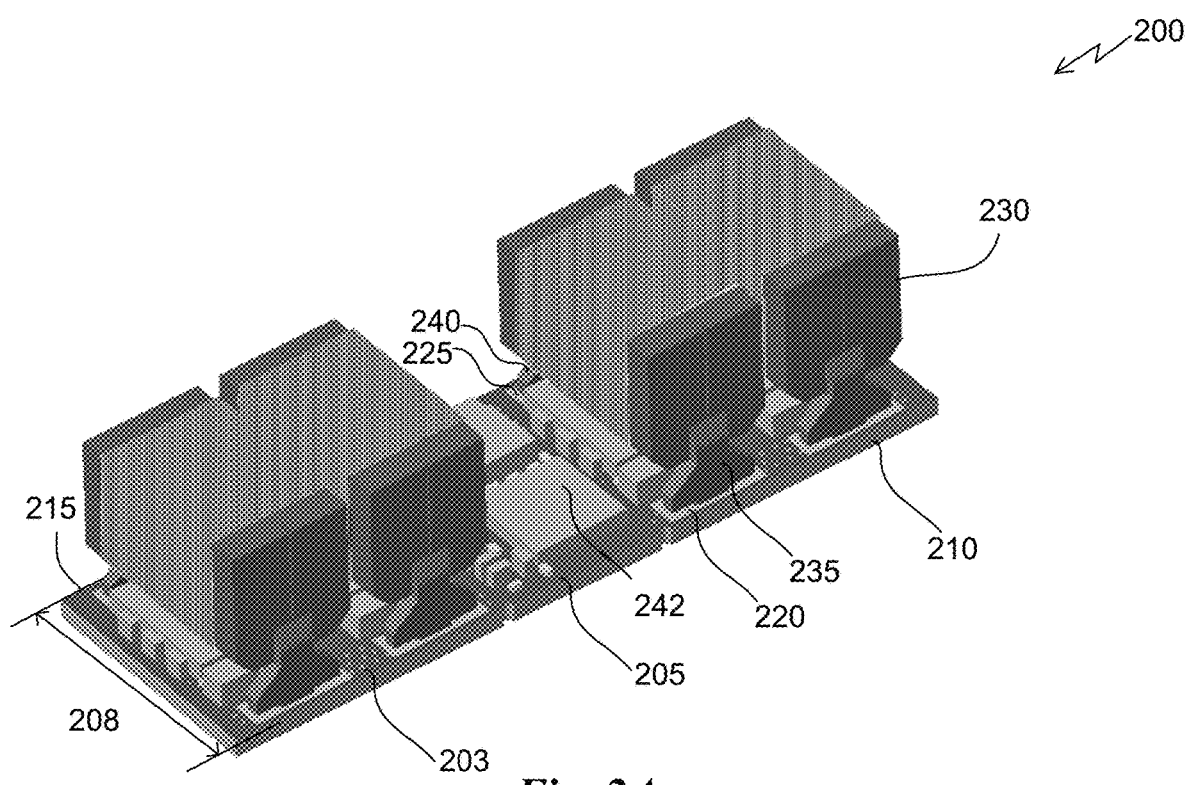
FIG. 2A illustrates a PCB assembly of a four-phase POL converter device.

FIG. 2A illustrates a PCB assembly 200 of a four-phase POL converter that outputs a maximum current at 160 A according to one or more examples of the present disclosure. The POL converter PCB assembly 200 includes a PWB 205 having a plurality of layers. For instance, the PWB 205 may include multiple conductive layers (e.g., copper layers) and multiple insulative/dielectric layers that separates the conductive layers. In some examples, the PWB 205 may include eight conductive layers (e.g., the conductive layers 512-526 as shown and described below relative to FIG. 5). However, it will be appreciated that the number of conductive layers and insulative layers included in the PWB 205 should not be limited in the present disclosure. The PWB 205 may also include vias or through-holes 203 (e.g., PTHs or NPTHs)

that may provide for electrical connections among different conductive layers or are designed for mechanical, thermal and isolation considerations.

Figures 4, 5:
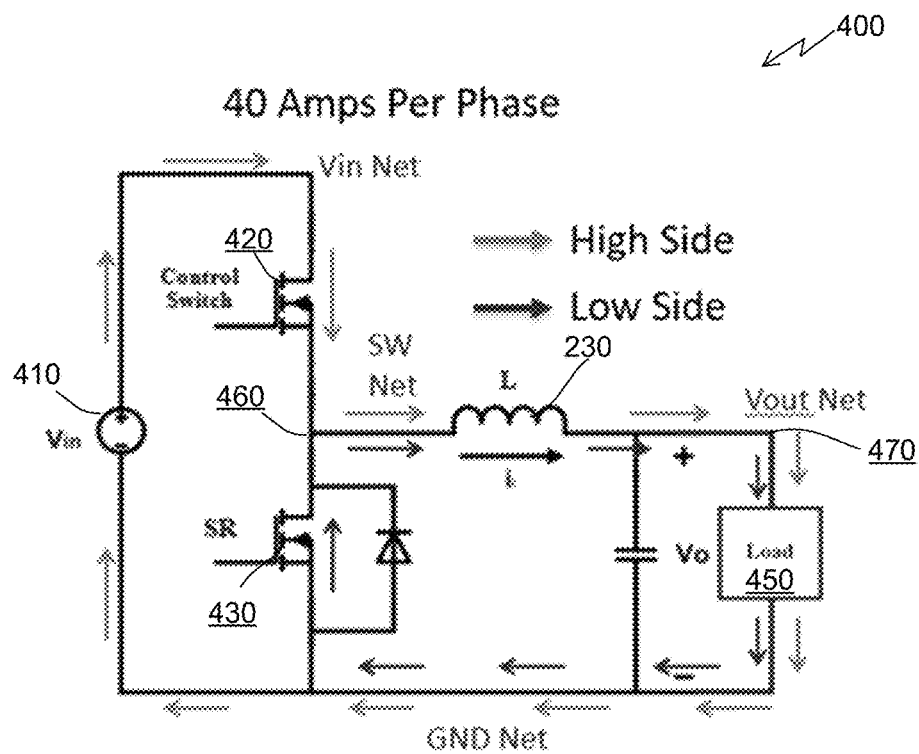
FIG. 4 illustrates a circuit model that models one phase power conversion circuit of the four-phase POL converter device of FIG. 2A.
FIG. 5 illustrates a device model simulating current flow through one leg of an inductor at a switch (SW) node as shown in FIG. 4.

The PCB assembly 200 includes a plurality of electrical components (e.g., inductors 230 and component 242) that are mounted on the PWB 205. Among the electrical components mounted on the PWB 205, the PCB assembly 200 includes four inductors 230 that each is included in circuitry for one phase of power conversion. Each phase of power conversion in the illustrated embodiment is configured to boost the output current by 40 A, and the four-phase power conversion is capable of output a maximum current of 160 A, but other values may be used. The inductors 230 included in the PCB assembly 200 are used for limiting power loss to heat and minimizing current ripple. Therefore, the inductors 230 may handle large current flow and generate a great amount of heat in operation. Due to the size of the inductors 230 and the way of hanging the inductors 230 over other components on the PWB 205, the inductors 230 are mounted to the PWB 205 via slots (e.g., the slotted portions 220 as shown and described below relative to FIG. 2B) that ensure mechanical stability to the inductors 230 against vibration and movement during manufacturing processes, such as a reflow process. The electrical components other than the inductors 230 include but are not limited to capacitors, resistors and transistors. The electrical components on the PWB 205 are electrically connected via traces patterned on each conductive layer (e.g., the conductive layers 512-526 as shown in FIG. 5 with more details) and PTHs 203 (or plated vias) that connect different conductive layers.

As shown in FIG. 2A, the inductors 230 are lined up in a row on the PWB 205 and both legs (e.g., a first leg 235 and a second leg 240) of each inductor 230 are placed close to edges (e.g., a first edge 210 and a second edge 215 as shown and described below relative to FIG. 2B) of the PWB 205. As shown in FIG. 2A, the width 208 of the PWB 205 is limited by the mounting areas for the inductors 230. According to the PCB design guideline, if the inductors 230 are mounted on slots (or slotted portions 220), the slots on the PWB 205 are placed away from edges of the PWB 205 by a minimum distance, so as to prevent breaking the PWB 205 while handing the PWB 205 during manufacturing. The way of mounting the inductor 230 through a pair of slots (e.g., the slotted portions 220) on the PWB 205 provides for robust mechanical stability to the inductor 230, however, at a cost of demanding more space on the PWB 205. The present disclosure provides for a PWB layout design that replaces one of the two slotted portions 220 (or slots) on the PWB 205 to a pad 225 to land one leg (e.g., the second leg 240) of an electrical component (e.g., the inductor 230) while the other leg (e.g., the first leg 235) of the electrical component is mounted on a slotted portion 220 that provides mechanical stability to the electrical component, thus allowing for a reduction of the footprint of the PWB 205 without compromising the mechanical rigidity of the device. By changing a slotted portion 220 to a pad 225 on PWB 205, the minimum distance requirement that is posed to a slot (e.g., the slotted portion 220) close to an edge (e.g., the first edge 210) of the PWB 205 is no longer required, thus, the width 208 of the PWB 205 can be reduced.

Figure 2B:
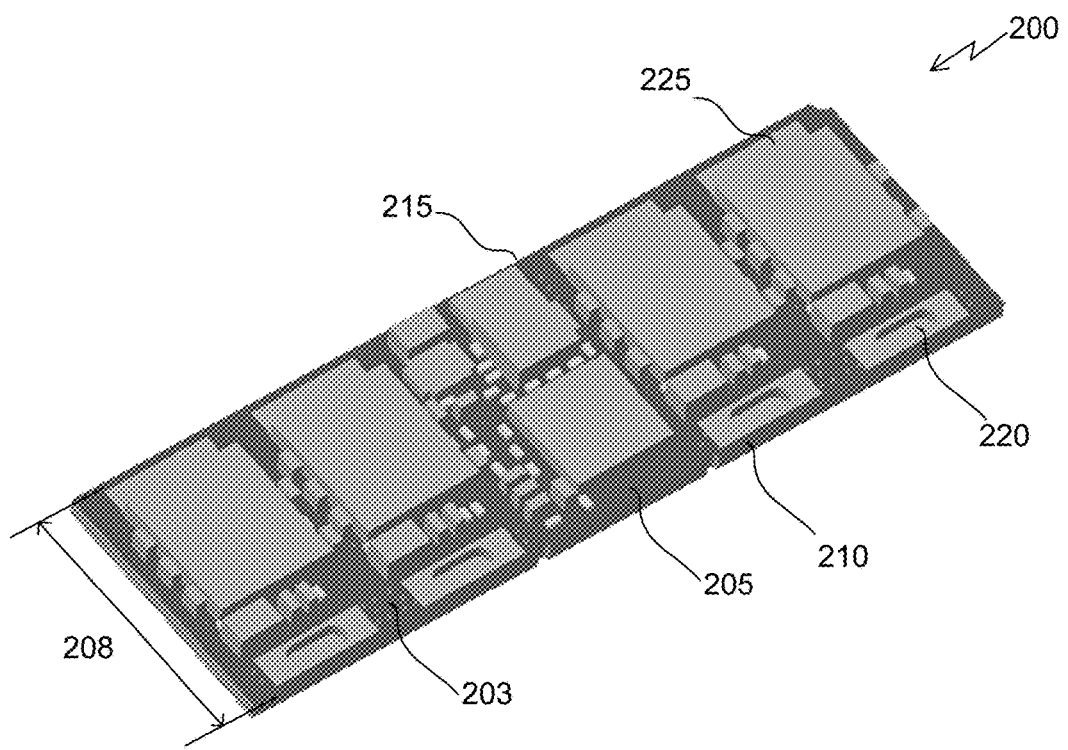
FIG. 2B illustrates the PCB assembly of the four-phase POL converter device of FIG. 2A by hiding the inductors mounted on the PWB.

FIG. 2B illustrates the PCB assembly 200 of the four-phase POL converter device of FIG. 2A by hiding the inductors 230 mounted on the PWB 205 according to one or more examples of the present disclosure. As shown in FIG. 2B, the PWB 205 included in the PCB assembly 200 is exposed with mounting areas for the inductor 230, which are a plurality of slotted portions 220 and a plurality of pads 225 that are paired with the slotted portions 220 on the PWB 205. The slotted portions 220 are indented into the PWB 205 such that the slotted portions 220 have fewer layers than the plurality of layers of the PWB 205. The plurality of slotted portions 220 on the PWB 205 are arranged in a row alongside a first edge 210 of the PWB 205. According to the PCB design guideline, each of the slotted portions 220 is required to be placed away from the first edge 210 of the PWB 205 by a minimum distance, so as to prevent breaking the PWB 205 around the slotted portions 220 during the manufacturing processes. Conventional design adopts a pair of slotted portions 220 (or slots) to mount an electrical component (e.g., the inductor 230 as shown in FIG. 2A), where both legs (e.g., the first leg 235 and the second leg 240 as shown in FIG. 2A) of the electrical component are inserted into the pair of slotted portions 220 to be mounted on the PWB 205. However, if a second set of slotted portions 220 are arranged along a second edge 215 of the PWB 205, the second set of slotted portions 220 also have to meet the minimum distance requirement similar to the set of slotted portions 220 close to the first edge 210 of the PWB 205, thus posing a strict limit to the width 208 of the PWB 205. Contrary to the conventional design, the PWB 205 is designed with a plurality of pads 225 to land the second legs 240 of the inductors 230 (as shown in FIG. 2A) according to one or more examples of the present disclosure. By applying this layout design, the minimum distance requirement is no longer posed to the pads 225 that are positioned in a row along the second edge 215 of the PWB 205, thus allowing for a reduction of the width 208 of the PWB 205 as well as the overall footprint of the PCB assembly 200.

Figure 3A:
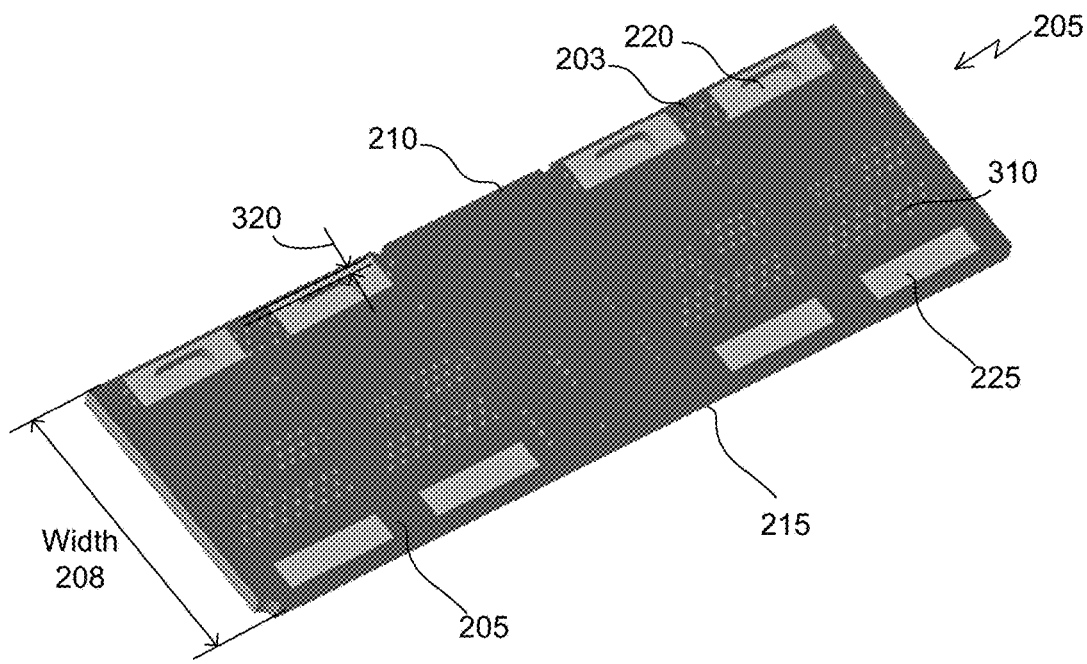
FIG. 3A illustrates the PWB in the four-phase POL converter device of FIG. 2A by hiding all the components mounted on the PWB.
Figure 6A:
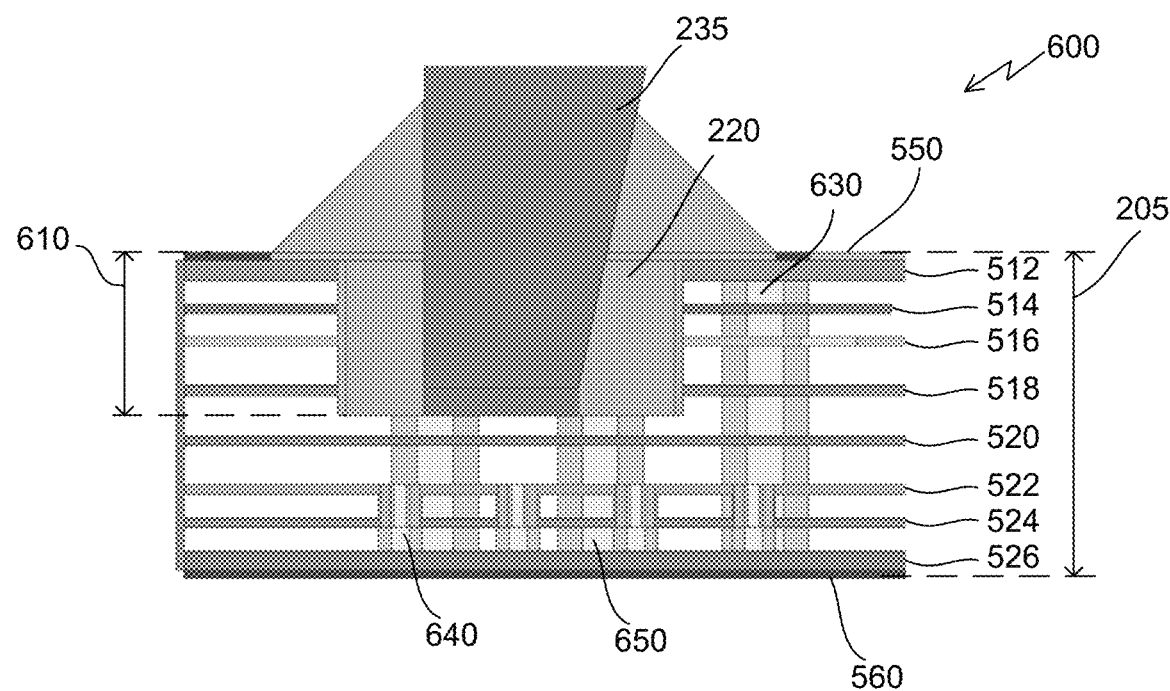
FIGS. 6A and 6B illustrate one leg of an inductor being inserted into a slotted portion that is indented into the PWB at different depths.

FIG. 3A illustrates the PWB 205 included in the PCB assembly 200 of the POL converter device of FIG. 2A by hiding all the components that are mounted on the PWB 205 according to one or more examples of the present disclosure. Other than the slotted portions 220 and the pads 225, the PWB 205 also includes components 310, such as through-holes 203 (e.g., PTHs and NPTHs) and/or ball grids for mounting electrical components other than the inductors 230. As mentioned before, the plurality of slotted portions 220 are arranged in a row along the first edge 210 of the PWB 205. The plurality of pads 225 that are paired with the plurality of slotted portions 220 are arranged in a row along a second edge 215 of the PWB 205. One of the dimensions (e.g., the width 208) of the PWB is affected by the way of positioning the slotted portions 220 and the pairing pads 225 for mounting the inductors 230. Each slotted portion 220 is placed at a first distance 320 away from the first edge 210 of the PWB 205, and the first distance 320 satisfies a minimum distance requirement according to the PCB design guideline. In some examples, the plurality of slotted portions 220 are indented into the PWB 205 with a same depth. In some variations, the slotted portions 220 may be indented into the PWB 205 with different depths (e.g., a first depth 610 as shown in FIG. 6A and a second depth 620 as shown and described below relative to FIG. 6B). Some of the slotted portions 220 may be through the PWB 205. It will be appreciated that the plurality of pairs of slotted portions 220 and pads 225 are not necessarily arranged in a row on the PWB 205 as shown in FIG. 3A. One or more pairs of slot portions 220 and the pads 225 may be positioned at a different orientation from the other pairs to meet actual requirements in the layout design.

Figure 3B:
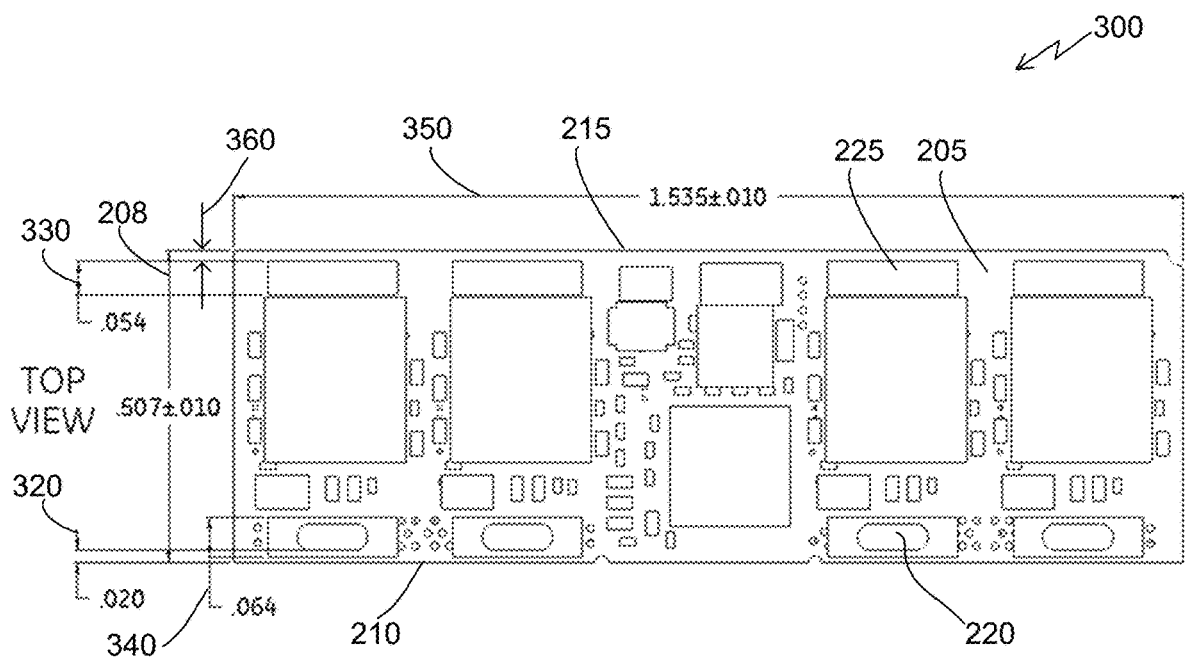
FIG. 3B illustrates a top view of the layout design of the four-phase POL converter device of FIG. 2A.

FIG. 3B illustrates a top view of a layout design 350 for the PCB assembly 200 of FIG. 2A according to one or more examples of the present disclosure. The PWB 205 of the PCB assembly 200 has a length 350 of 1.535 inches and a width 208 of 0.507 inches. The slotted portions 220 are positioned at a first distance 320, for example 0.02 inches, away from the first edge 210 of the PWB 205, which satisfies the minimum distance requirement according to the PCB design guideline. The pads 225 that are paired with the slotted portions 220 are positioned along the second edge 215 of the PWB 205. The pads 225 are position away from the second edge 215 at a second distance 360. The second distance 360 can be smaller than the first distance 340, because the minimum distance restricting the slotted portions 220 do not restrict the pads 225. As such, designing of pads 225 for landing the second legs 240 of the inductors 230 instead of slotted portions 220 allows for a reduction of the width 208 of the PWB 205. The foregoing illustrated layout design strategies can be applied to other semiconductor devices to achieve reduction of the footprint for those devices.

The following examples describe selection of a first leg 230 that is mounted on a slotted portion 220 and a second leg 240 that is landed on a pad 225 based on current simulating across the inductor 230.

FIG. 4 illustrates a circuit model 400 simulating one phase of power conversion of the POL converter assembly 200 of FIG. 2A. The circuit model 400 converts the power from an input source 410 to power a load 450. The circuit model 400 includes one inductor 230, and current that flows through the inductor 230 is simulated and presented in the device modeling as shown in FIG. 5. The inductor 230 in the circuit model 400 is connected to a switch (SW) node 460 at one side and an output (Vout) node 470 at the other side. The SW node 460 is between two field-effect transistors (FETs), that is a control switch 420 and a FET included in a synchronous rectifier (SR) 430. A high side current flows through the control switch 420, and a low side current flows through the SR 430. The load 450 in the circuit model 400 is connected between the Vout node 470 and a ground (GND) node. Additionally, a capacitor may be connected in parallel to the load 450, where the capacitor may be used to filter the output power. As shown in FIG. 4, a number of nets may be defined in the circuit model to represent collections of pads/legs of electrical components on the PCB that are electrically or logically connected to one another. For example, a ground net (GND Net) is defined so that all of the pads that should be connected to ground connect to the GND Net. An input net (Vin Net) is defined for the pads connected to the input source 410. A switching net (SW Net) is defined for the pads connected to the SW node 460. An output net (Vout Net) is defined for the pads connected to the load 450.

The POL converter device disclosed in the foregoing examples includes four phases of power conversion, where each phase of power conversion includes an inductor 230 and other electrical components. As shown in the circuit model 400, the control switch 430 controls on/off state of the respective phase of power conversion. With the control switch 430 on, the inductor 230 works together with other components such as a SR 430 to buck down the input voltage and boosts the output current by 40 Amps per phase. As such, the POL converter device 200 powers an external load with a selection of output voltage and current settings by selectively turning on/off a number of phases of power conversions. In some examples, one or more capacitors may be coupled to the load 450 to filter the output voltage, so as to further reduce ripples in the output power and improve noise margins.

Since the load 450 is on a customer board (e.g., a circuit board) where the POL converter device 200 may be mounted, the current flow in a leg of the inductor 230 that is connected to the Vout node 470 travels in a direction across the PWB 205 towards the customer board. In other words, the current flows across multiple conductive/dielectric layers in the PWB 205. Therefore, the leg of the inductor 230 at the output node 470 can be the first leg 235 that is inserted in a slotted portion 220 (shown in FIG. 2A). In some examples, the slotted portion 220 can be plated with copper, which provides for electrical connections among different conductive layers (e.g., the conductive layers 512-526 as shown and described below relative to FIG. 5).

FIG. 5 illustrates a device model 500 simulating current flow 540 at the SW node 460 of the circuit model 400 in FIG. 4 according to one or more examples of the present disclosure. One leg 536 of the inductor 230 is connected to the SW node 460, which is also connected to a component 538. The component 538 may be an electronic module having the control switch 420 and/or the SR as shown in FIG. 4 integrated therein. During operation, current flows from the component 538 to the leg 536 of the inductor 230. FIG. 5 demonstrates the current flow 540 through cross section of the leg 536 of the inductor 230 that is connected to the SW node 460. The PWB 205 includes eight conductive layers, which are conductive layers 512-526 stacking along the thickness of the PWB 205. The conductive layers 512 and 514 are electrically connected by one or more PTHs 534. The conductive layers 514 and 526 are electrically connected by one or more PTHs 528. The conductive layers 526 and 528 are electrically connected by one or more PTHs 532. The PCB assembly 200 includes a first surface 550 that is mounted with electrical components such as the inductors 230 and the component 538, and a second surface 560 that is formed with a finished pattern 530 that results in final metallization under the solder. The final metallization under the solder may be formed by a process of solder mask over bare copper (SMOBC).

The simulation results shown in FIG. 5 indicate that at the SW node 460, most of the current flows on the top layer 512 and 514 close to the first surface 550 where the components are mounted onto. Therefore, the leg 536 of the inductor 230 can have a surface mount joint that lands on a pad 225 that is connected to the SW node 460. In other words, the leg 536 of the inductor 230 that is connected to the SW node 460 can be the second leg 240 that lands on the pad 225 on the PWB 205.

Figure 6B:
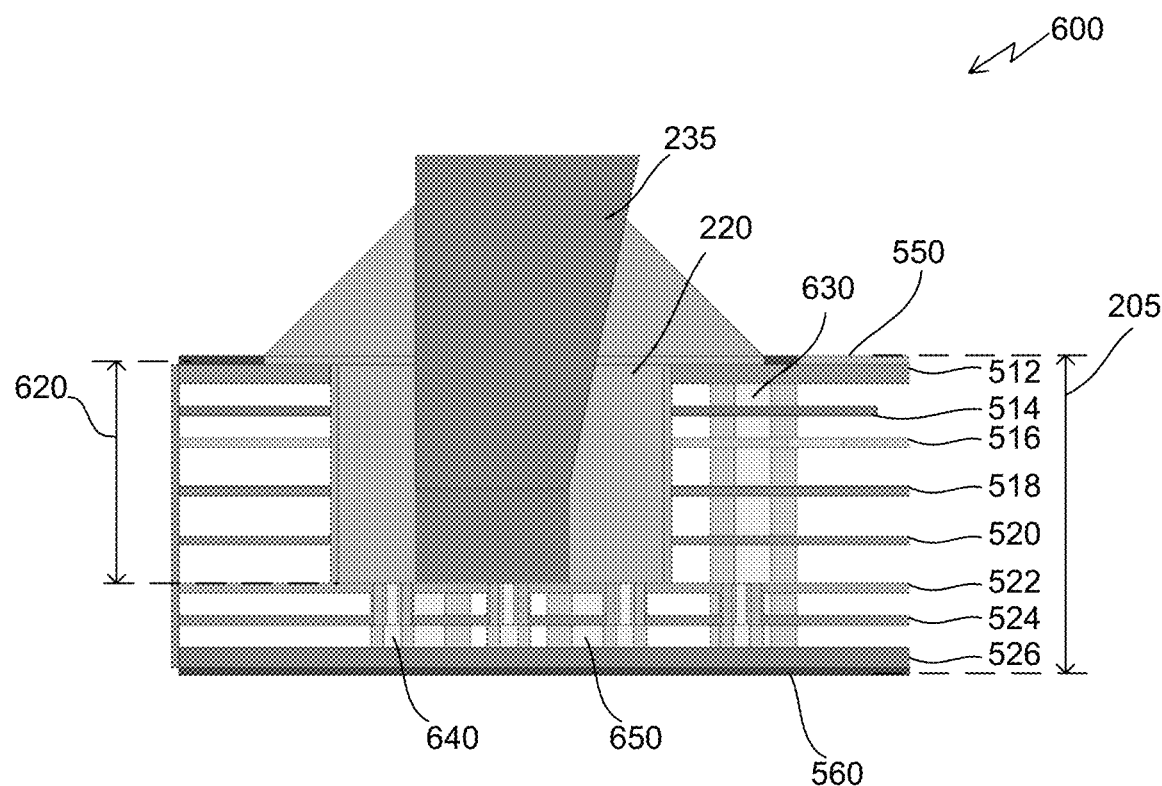

FIGS. 6A and 6B are a cross-section 600 of the PCB assembly 200 that illustrates a first leg 235 of an inductor 230 mounted on a slotted portion 220 that has different depths according to one or more examples of the present disclosure. Similar to the cross-section of PWB 205 shown in FIG. 5, the cross-section 600 of PWB 205 in FIGS. 6A and 6B also shows eight conductive layers, which are denoted in the figures as a first layer 512, a second layer 514, a third layer 516, a fourth layer 518, a fifth layer 520, a sixth layer 522, a seventh layer 524, and an eighth layer 526 along the thickness of the PWB 205.

The conductive layers in the PWB 205 are interconnected through a plurality of PTHs (e.g., PTHs 630, 640 and 650). The difference between FIGS. 6A and 6B lies in the different depths of the slotted portion 220 that is indented into the PWB 205. In FIG. 6A, the slotted portion 220 is indented into the PWB 205 with a first depth 610. The first depth 610 extends through a first number of conductive layers, including the first conductive layer 512, the second conductive layer 514, the third conductive layer 516 and the fourth conductive layer 518.

In FIG. 6B, the slotted portion 220 is indented into the PWB 205 with a second depth 620. The second depth 620 extends through a second number of conductive layers, including the first conductive layer 512, the second conductive layer 514, the third conductive layer 516, the fourth conductive layer 518 and the fifth conductive layer 520. In the embodiment shown, the bottom of the first leg 235 is connected to the sixth conductive layer 522.

The number of conductive layers that the depth of a slotted portion 220 extends through is not limited by the exemplary embodiment described in the present disclosure. It should be appreciated that different structural arrangements can also be used depending on the particular layout of a design. In some examples, the slotted portion 220 for mounting the first leg 235 of the inductor 230 is connected to an output node (e.g., the Vout node 470 in FIG. 4), and the current flows out of the first leg 235 of the inductor 230, across a portion of the PWB 205 that the slotted portion 220 is not indented into and towards the second surface 560 of the PWB 205 that is mounted, for example, to a customer board. As illustrated in FIG. 6A, the portion of the PWB 205 that the current travels through includes an insulative layer between the fourth conductive layer 518 and the fifth conductive layer 520, the conductive layer 520, an insulative layer between the fifth conductive layer 520 and the sixth conductive layer 522, the sixth conductive layer 522, an insulative layer between the sixth conductive layer 522 and the seventh conductive layer 524, the seventh conductive layer 524, an insulative layer between the seventh conductive layer 524 and the eighth conductive layer 526, and the eighth conductive layer 526.

As illustrated in FIG. 6B, the portion of the PWB 205 that the current travels through extends across the sixth conductive layer 522, an insulative layer between the sixth conductive layer 522 and the seventh conductive layer 524, the seventh conductive layer 524, an insulative layer between the seventh conductive layer 524 and the eighth conductive layer 526, and the eighth conductive layer 526. When the slotted portion 220 is indented deeper into the PWB 205, the current that flows from the first leg 235 of the inductor 230 travels along a shorter path towards the custom board and passes less dielectrics (e.g., the insulation layers between the conductive layers 518 and 526 as shown in FIG. 6A, and the insulation layers between the conductive layers 522 and 526 as shown in FIG. 6B) while traveling through PTHs or plated vias (e.g., the PTHs 650) to reach the customer board, which cause a lower resistance against the current flow, thus resulting in a lower loss that is in the form of generated heat in the PWB 205. Additionally, when the second leg 235 of the inductor 230 is inserted into a deeper slotted portion 220, the inductor 230 can have better mechanical stability. On the other hand, a shallower slotted portion 220 may be more easily filled with solder during a soldering process for mounting an electrical component (e.g., an inductor 230) thus ensuring a higher yield of good quality solder connections. In some instances, the slotted portions 220 on the PWB 205 may have different depths according to actual design considerations.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A printed circuit board (PCB) assembly comprising:
    a printed wiring board (PWB) comprising:
        a plurality of layers, the plurality of layers including conductive layers and insulative layers, wherein one or more of the insulative layers is a prepreg layer that is halogen-free;
        one or more slotted portions on a surface of the PWB, wherein each of the one or more slotted portions is indented into the PWB such that the slotted portion has fewer layers than the plurality of layers; and
        one or more pads disposed on the surface of the PWB, wherein the one or more pads is paired with a respective one slotted portion of the one or more slotted portions; and
    one or more electrical components disposed on the surface of the PWB, each of the one or more electrical components comprising only a first leg and a second leg that are positioned on opposite sides of the electrical component with a body of the electrical component positioned in-between the first leg and the second leg, wherein the first leg of each of the one or more electrical components is inserted into one slotted portion of the one or more slotted portions, and the second leg of the each of the one or more electrical components is mounted on one pad of the one or more pads that is paired with the one slotted portion.

2. The PCB assembly of claim 1, wherein the one or more slotted portions is located adjacent a first edge of the PWB and offset therefrom by a first distance.

3. The PCB assembly of claim 2, wherein the one or more pads is located adjacent a second edge of the PWB and offset therefrom by a second distance, wherein the second distance is shorter than the first distance.

4. The PCB assembly of claim 1, wherein at least one slotted portion extends through two or more electrically conductive layers of the plurality of layers, and wherein the at least one slotted portion is at least partially plated with copper that electrically interconnects the two or more electrically conductive layers that the at least one slotted portion extends through.

5. The PCB assembly of claim 4, wherein the at least one slotted portion electrically connects at least two different conductive layers.

6. The PCB assembly of claim 1, wherein a first slotted portion on the PWB is indented into the PWB with a first depth and a second slotted portion on the PWB is indented into the PWB with a second depth.

7. The PCB assembly of claim 6, wherein the first depth of the first slotted portion extends through a first number of conductive layers in the PWB.

8. The PCB assembly of claim 6, wherein the second depth of the second slotted portion extends through a second number of conductive layers in the PWB, and wherein the first number of conductive layers is different from the second number of conductive layers.

9. The PCB assembly of claim 1, wherein the one or more electrical components are one or more inductors.

10. The PCB assembly of claim 9, wherein the second legs of the one or more inductors are mounted on the one or more slotted portions that are electrically connected to an output node that is connected to a load, and wherein the load is circuitry integrated on a circuit board that the PCB assembly is mounted on.

11. The PCB assembly of claim 9, wherein the first legs of the one or more inductors are mounted on the one or more pads that are electrically connected to at least one switching node, and wherein the at least one switching node is connected to one or more electrical components that are mounted on the surface of the PWB.

12. A printed wiring board (PWB), comprising:
a plurality of layers, the plurality of layers including conductive layers and insulative layers, wherein one or more of the insulative layers is a prepreg layer that is halogen-free;
one or more slotted portions on a surface of the PWB, wherein each of the one or more slotted portions is indented into the PWB such that the slotted portion has fewer layers than the plurality of layers; and
one or more pads disposed on the surface of the PWB, wherein the one or more pads is paired with a respective one slotted portion of the one or more slotted portions, wherein a slotted portion of the one or more slotted portions is configured to accept a first leg of an electrical component and a pad of the one or more pads is configured to accept a second leg of the electrical component, wherein the electrical component comprises only the first leg and the second leg, wherein the first leg and the second leg are positioned on opposite sides of the electrical component with a body of the electrical component positioned in-between the first leg and the second leg.

13. The PWB of claim 12, wherein the one or more slotted portions is located adjacent a first edge of the PWB and offset therefrom by a first distance.

14. The PWB of claim 13, wherein the one or more pads is located adjacent a second edge of the PWB and offset therefrom by a second distance, wherein the second distance is shorter than the first distance.

15. The PWB of claim 12, wherein at least one slotted portion extends through two or more electrically conductive layers of the plurality of layers, and wherein the at least one slotted portion is at least partially plated with copper that electrically interconnects the two or more electrically conductive layers that the at least one slotted portion extends through.

16. The PWB of claim 15, wherein the at least one slotted portion electrically connects at least two different conductive layers.

17. The PWB of claim 12, wherein a first slotted portion on the PWB is indented into the PWB with a first depth and a second slotted portion on the PWB is indented into the PWB with a second depth.

18. The PWB of claim 17, wherein the first depth of the first slotted portion extends through a first number of conductive layers in the PWB.

19. The PWB of claim 18, wherein the second depth of the second slotted portion extends through a second number of conductive layers in the PWB, and wherein the first number of conductive layers is different from the second number of conductive layers.

20. The PWB of claim 12, wherein the one or more slotted portions are electrically connected to an output node that is connected to a load, wherein the load is a circuitry integrated on a circuit board that the PWB is mounted on, wherein the one or more pads are electrically connected to at least one switching node, and wherein the at least one switching node is connected to a plurality of electrical components that are mounted on the surface of the PWB, wherein the plurality of electrical components comprises the electrical component.

* * * * *